US 6,621,315 B2

(12) United States Patent
Heo et al.

(10) Patent No.: US 6,621,315 B2
(45) Date of Patent: Sep. 16, 2003

(54) DELAY LOCKED LOOP CIRCUIT AND METHOD HAVING ADJUSTABLE LOCKING RESOLUTION

(75) Inventors: Nak Won Heo, Suwon-Si (KR); Young Hyun Jun, Seoul-Si (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/135,454

(22) Filed: May 1, 2002

(65) Prior Publication Data
US 2003/0085744 A1 May 8, 2003

(30) Foreign Application Priority Data
Nov. 7, 2001 (KR) .............................. P2001-69229

(51) Int. Cl.⁷ ................................................ H03L 7/06
(52) U.S. Cl. ........................ 327/158; 327/270; 327/277
(58) Field of Search ................................ 327/141, 146, 327/149, 150, 151, 153, 154, 155, 158, 159, 160, 270–273, 277, 279, 284, 299

(56) References Cited

U.S. PATENT DOCUMENTS

| | | | |
|---|---|---|---|
| 5,740,123 A | | 4/1998 | Uchida ........................ 365/233 |
| 5,841,707 A | * | 11/1998 | Cline et al. .................. 365/194 |
| 5,940,344 A | * | 8/1999 | Murai et al. ................. 365/233 |
| 6,100,736 A | * | 8/2000 | Wu et al. ..................... 327/159 |
| 6,137,334 A | * | 10/2000 | Miller, Jr. et al. ........... 327/271 |
| 6,150,856 A | | 11/2000 | Morzano ..................... 327/149 |
| 6,151,270 A | | 11/2000 | Jeong ........................... 365/233 |
| 6,154,073 A | * | 11/2000 | Choi ............................. 327/161 |
| 6,181,174 B1 | | 1/2001 | Fujieda et al. ............... 327/158 |
| 6,188,640 B1 | | 2/2001 | Aikawa et al. .............. 365/233 |
| 6,212,127 B1 | | 4/2001 | Funaba et al. ............... 365/233 |
| 6,240,042 B1 | | 5/2001 | Li ................................. 365/233 |
| 6,266,283 B1 | | 7/2001 | Fujimori .................... 365/189.05 |

FOREIGN PATENT DOCUMENTS

| | | |
|---|---|---|
| JP | 11-45573 | 2/1999 |
| JP | 2000-195263 | 7/2000 |
| JP | 2000-231420 | 8/2000 |
| JP | 2000-231788 | 8/2000 |
| KR | 1999-0040859 | 6/1999 |

OTHER PUBLICATIONS

Korean Patent Abstacts (KR), Publication No. 1020000062099, "Synchronous Semiconductor Memory Device Having Positive Gas Latency Function and Method for Controlling Gas Latency", Dong Yang Lee et al., Oct. 25, 2000.

Patent Abstracts of Japan, Application No. 07240902, "Semiconductor Storage", Takai Yasuhiro, Oct. 25, 1995.

Atsushi Hatakeyama et al., "A 256–Mb SDRAM Using a Register–Controlled Digital DLL", IEEE Journal of Soild–State Circuits, vol. 32, No. 11, Nov. 1997, pp. 1728–1734.

Feng Lin et al., "A Register–Controlled Symmetrical DLL for Double–Data–Rate DRAM", IEEE Journal of Solid–State Circuits, vol. 34, No. 4, Apr. 1999, pp. 565–566.

* cited by examiner

Primary Examiner—Thomas P. Callahan
Assistant Examiner—An T. Luu
(74) Attorney, Agent, or Firm—Volentine Francos, PLLC

(57) ABSTRACT

A delay line receives an input clock signal and includes a cascaded plurality of unit delay circuits. A mode register set stores a value indicative of a column-address-strobe (CAS) latency of the memory device, and an adjustment circuit varies a delay time of the unit delay circuits according to the CAS latency stored in the mode register set. A phase detector detects a phase difference between the input clock signal and an output clock signal of the delay line, and a control circuit which controls an enabled state of the unit delay circuits according to an output of said phase detector.

28 Claims, 10 Drawing Sheets

DELAY LOCKED LOOP CIRCUIT AND METHOD HAVING ADJUSTABLE LOCKING RESOLUTION

BACKGROUND OF THE INVENTION

1. Filed of the Invention

The present invention generally relates to methods and circuits for delaying a reference clock signal to obtain a delayed clock signal which is delayed relative to the reference clock signal, and more particularly, the present invention relates to delay locked loop (DLL) circuits and methods.

2. Description of the Related Art

A delay locked loop (DLL) circuit functions to delay a reference clock signal by a preset time period to thereby generate a delayed clock signal which is delayed relative to the reference clock signal. The generation of delayed clock signals is generally necessary in certain circuits which exhibit relatively high integration densities and which are synchronized with external clock signals. Such circuits include Rambus DRAMs (RDRAMs) and Synchronous DRAMs (SDRAMs).

Generally, external clock signals are supplied via an input pin of a semiconductor integrated circuit, and from there they are distributed to various component parts of the circuit. A clock signal arriving at a component part which is located relatively far from the input pin may be considerably delayed compared to the same clock signal arriving at a component part directly adjacent the input pin. As such, as clock frequency increases, it becomes more and more difficult to maintain synchronization between the various component parts of the semiconductor integrated circuit. Also, the delay of the clock signal can deteriorate the high frequency operation of the semiconductor integrated circuit. That is, the time period needed to output data (output data access time) is increased.

Particularly in an effort to facilitate synchronization of components, the semiconductor integrated circuit may be equipped with a DLL circuit which receives the external clock signals and generates internal clock signals that are delayed for a predetermined period of time relative to the external clock signals. These delayed internal clock signals are selectively supplied as clock signals to the respective component parts of the semiconductor integrated circuit.

FIG. 1 is a block diagram of a conventional register-controlled DLL (RDLL). As shown, an external clock signal CLKin is delayed by a delay line 13 to produce an internal clock signal CLKout which is delayed relative to the external clock signal CLKin. The delay line 13 includes a plurality of unit delay circuits (not shown) which are selectively made operational in response to respective control signals S1 through Sn. An amount of delay of the internal clock signal CLKout relative to the external clock signal CLKin depends on a number of the unit delay circuits which are effectively enabled by the control signals S1 through Sn.

A delay compensator 17 outputs a signal CLKout' based on an input internal signal CLKout. A phase detector 11 detects a phase difference between the signal CLKout' and the external clock signal CLKin, and generates a shift right (SR) signal or a shift left (SL) signal based on the phase of the internal signal CLKout (or signal CLKout') relative to that of the external signal CLKin. In particular, an SR signal is generated when the internal signal CLKout lags behind the external signal CLKin, and a SL signal is generated when the internal signal CLKout leads the external signal CLKin.

A control circuit 15 (which is essentially a shift register) shifts the output control signals S1 through Sn in a direction which is responsive to the SR signal or the SL signal. In this manner, the number of unit delay circuits which are enabled in the delay line 13 is varied based on variations in the values of the control signals S1 through Sn. As such, the delay time of the delay line 13 is varied based on the phase difference between the external clock signal CLKin and the internal clock signal CLKout.

FIG. 2 shows the relationship between a clock period tCC of an operational clock and a delay time td of the unit delay circuits in the conventional DLL of FIG. 1. The illustrated relationships are based on a synchronous DRAM in which a CAS latency (CL) is 3 when the frequency of an operational clock is within the range of 166 MHz–200 MHz, the CL is 4 when the frequency of the operational clock is within the range of 200 MHz–250 MHz, and the CL is 5 when the frequency of the operational clock is within the range of 250 MHz–300 MHz.

Generally, the DLL circuit must have a wide locking range to operate within a wide frequency range. In addition, the DLL circuit must include a sufficient number of unit delay circuits each having a minute delay time in order to achieve a fine locking resolution, particularly in a high-frequency domain.

The delay time td of a unit delay circuit effectively defines the locking resolution. For example, to obtain a specified locking resolution in the high-frequency domain (CL=5), the delay time td of the unit delay circuits may be designed to be ⅙ of a nanosecond (ns). In this case, as shown in FIG. 2, there must be at least 36 unit delay circuits in the delay line 13 of FIG. 1 to guarantee operation in the low-frequency domain (CL=3). As such, while the locking resolution is ⅙ ns in the low-frequency domain (CL=3), the worst case locking time is 36 cycles. As such, the locking time becomes undesirably long.

On the one hand, the delay time of the unit delay circuits should be relatively long when operating in the low-frequency domain, to thereby reduce the number of cycles of the worst case locking time. On the other hand, the delay time of the unit delay circuits must be made relatively short when operating in the high-frequency domain to achieve the necessary locking resolution, and accordingly, the number of cycles of the worst case locking time in the low frequency domain is unavoidably increased. In other words, locking time in a low frequency domain (CL=3) is increased if the unit delay time td is shortened to increase resolution in a high-frequency domain (CL=5).

SUMMARY OF THE INVENTION

According to one aspect of the present invention, a delay locked loop circuit for a memory device is provided in which a delay line receives an input clock signal and includes a cascaded plurality of unit delay circuits. An adjustment circuit varies a delay time of the unit delay circuits according to a column-address-strobe (CAS) latency of the memory device. A phase detector detects a phase difference between the input clock signal and an output clock signal of the delay line, and a control circuit which controls an enabled state of the unit delay circuits according to an output of said phase detector.

According to another aspect of the present invention, a delay locked loop method for a memory device is provided which includes delaying an input clock signal to obtain a delayed clock signal by passing the input clock signal through a delay line having a cascaded plurality of unit delay circuits, controlling an enabled state of each of the unit delay circuits according to a phase difference between the input clock signal and delayed clock signal, and varying a delay time of the unit delay circuits according to a column-address-strobe (CAS) latency of the memory device.

According to still another aspect of the present invention, a delay locked loop circuit for a memory device is provided in which a delay line receives an input clock signal and includes a cascaded plurality of unit delay circuits. A shift register circuit having plural circuit stages outputs parallel control signals to the unit delay circuits, respectively, wherein the parallel control signals constitute a multi-bit output of the shift register circuit. Both a direction and a number of stages of each bit-shift operation of the shift register circuit are variable. A phase detector detects a phase difference between the input clock signal and an output clock signal of the delay line, and the direction of the bit-shift operation of the shift register circuit is controlled by an output of the phase detector. A number of stages of the bit-shift operation of the shift register circuit is controlled by a column address strobe (CAS) latency of the memory device.

According to yet another aspect of the present invention, a delay locked loop method for a memory device is provided which includes delaying an input clock signal to obtain a delayed clock signal by passing the input clock signal through a delay line having a cascaded plurality of unit delay circuits, generating a multi-bit control signal which controls an enabled state of each of the plurality of unit delay circuits, and bit-shifting the multi-bit control signal in a direction corresponding to a phase difference between the input clock signal and delayed clock signal, and by a number of bits corresponding to a column address strobe (CAS) latency of the memory device.

BRIEF DESCRIPTION OF THE DRAWINGS

The present invention will become more readily apparent from the detailed description of the preferred embodiments that follows, with reference to the accompanying drawings, in which.

DETAILED DESCRIPTION OF THE PREFFERED EMBODIMENTS

Figure 3:
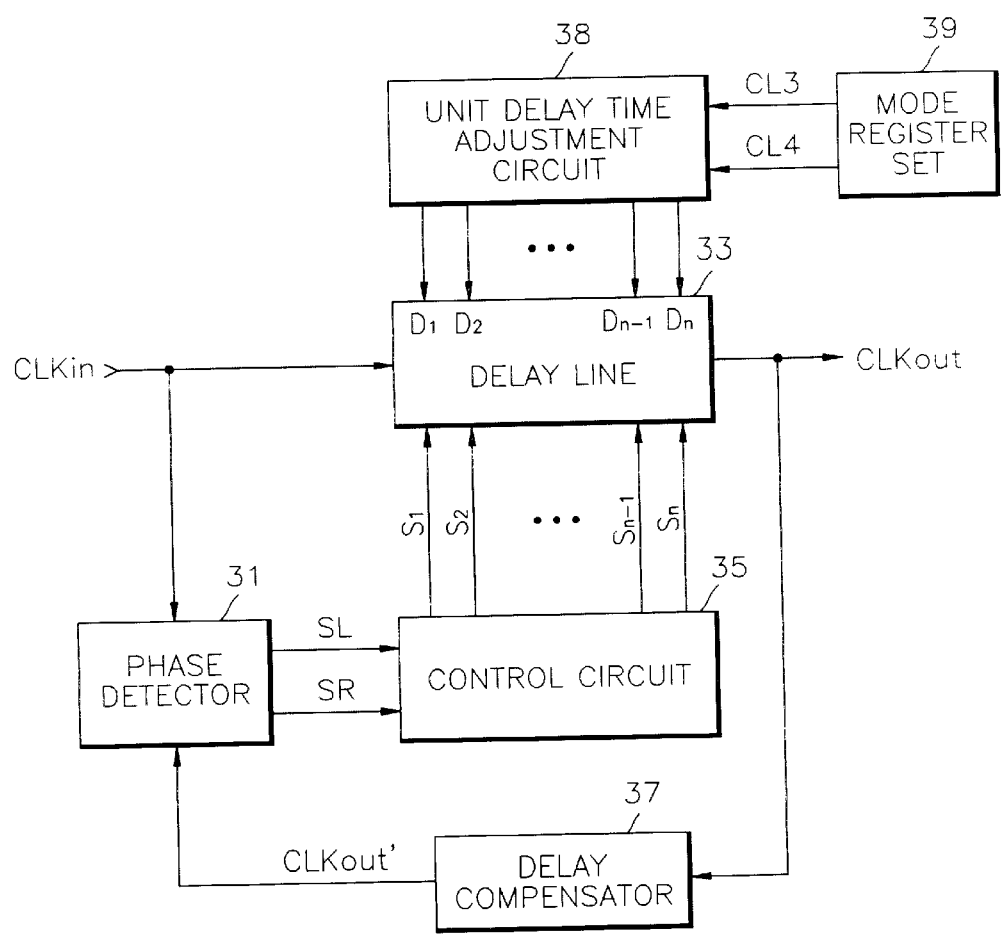
FIG. 3 is a block diagram of a DLL circuit according to a first embodiment of the present invention.

FIG. 3 is a block diagram of a DLL circuit according to a first embodiment of the present invention. The DLL circuit of this embodiment includes a phase detector 31, a delay line 33, a control circuit 35, a delay compensator 37, a unit delay time adjustment circuit 38, and a Mode register set 39.

As shown, an external clock signal CLKin is delayed by the delay line 33 to produce an internal clock signal CLKout which is delayed relative to the external clock signal CLKin. The delay line 33 includes a plurality of unit delay circuits (not shown) which are selectively enabled in response to respective control signals S1 through Sn. The unit delay circuits are cascaded (connected in series) such that an amount of delay of the internal clock signal CLKout relative to the external clock signal CLKin depends on a number of the unit delay circuits which are effectively enabled by the control signals S1 through Sn.

The phase detector 31 receives a signal CLKout' (which is the internal signal CLKout after passing through the delay compensator 37) and the external signal CLKin. When the DLL circuit is used in a synchronous DRAM, the delay compensator 37, which is a kind of delay circuit, has a delay time corresponding to the sum of the delay time of an input buffer for buffering the external signal CLKin and the delay time when outputting data to an output pin in response to the internal signal CLKout. The delay compensator 37 may be omitted from the DLL circuit, and in this case, the internal clock signal CLKout is directly input to the phase detector 31.

The phase detector 31 detects a phase difference between the internal clock signal CLKout (or CLKout') and the external clock signal CLKin. Further, the phase detector 31 generates a shift right (SR) signal or a shift left (SL) signal based on the phase of the internal signal CLKout relative to the external signal CLKin. That is, an SR signal is generated when the internal signal CLKout lags behind the external signal CLKin, and an SL signal is generated when the internal signal CLKout leads the external signal CLKin.

A control circuit 35 (which may be constituted by a shift register) shifts the output control signals S1 through Sn in a direction which is responsive to the SR signal or the SL signal. In this manner, the number of unit delay circuits which are enabled in the delay line 33 is varied based on variations in the values of the control signals S1 through Sn. As such, the delay time of the delay line 33 is varied based on the phase difference between the external clock signal CLKin and the internal clock signal CLKout.

As will be described in more detail below, the unit delay time adjustment circuit 38 varies the delay time of each of the unit delay circuits in the delay line 33 in response to control signals indicative of a column address strobe (CAS) latency. In this example, the control signals are a signal CL3 and a signal CL4 output from the Mode register set 39. The Mode register set 39 is typically included in a synchronous DRAM to control operational modes according to an operational frequency of the synchronous DRAM. For example, if the frequency of an external clock signal CLKin (an operational) clock is within the range of 166 MHz–200 MHz, the CAS latency is 3; if the frequency of the external clock signal CLKin is within the range of 200 Mhz–250 Mhz, the CAS latency is 4; and if the frequency of the external clock signal CLKin is within the range of 250 MHz–300 MHz, the CAS latency is 5.

The CAS latency signal CL3 is activated when CAS latency is 3, and the CAS latency signal CL4 is activated when CAS latency is 4. Neither CAS latency signal CL3 nor CL4 is activated when the CAS latency is 5.

Figure 4:
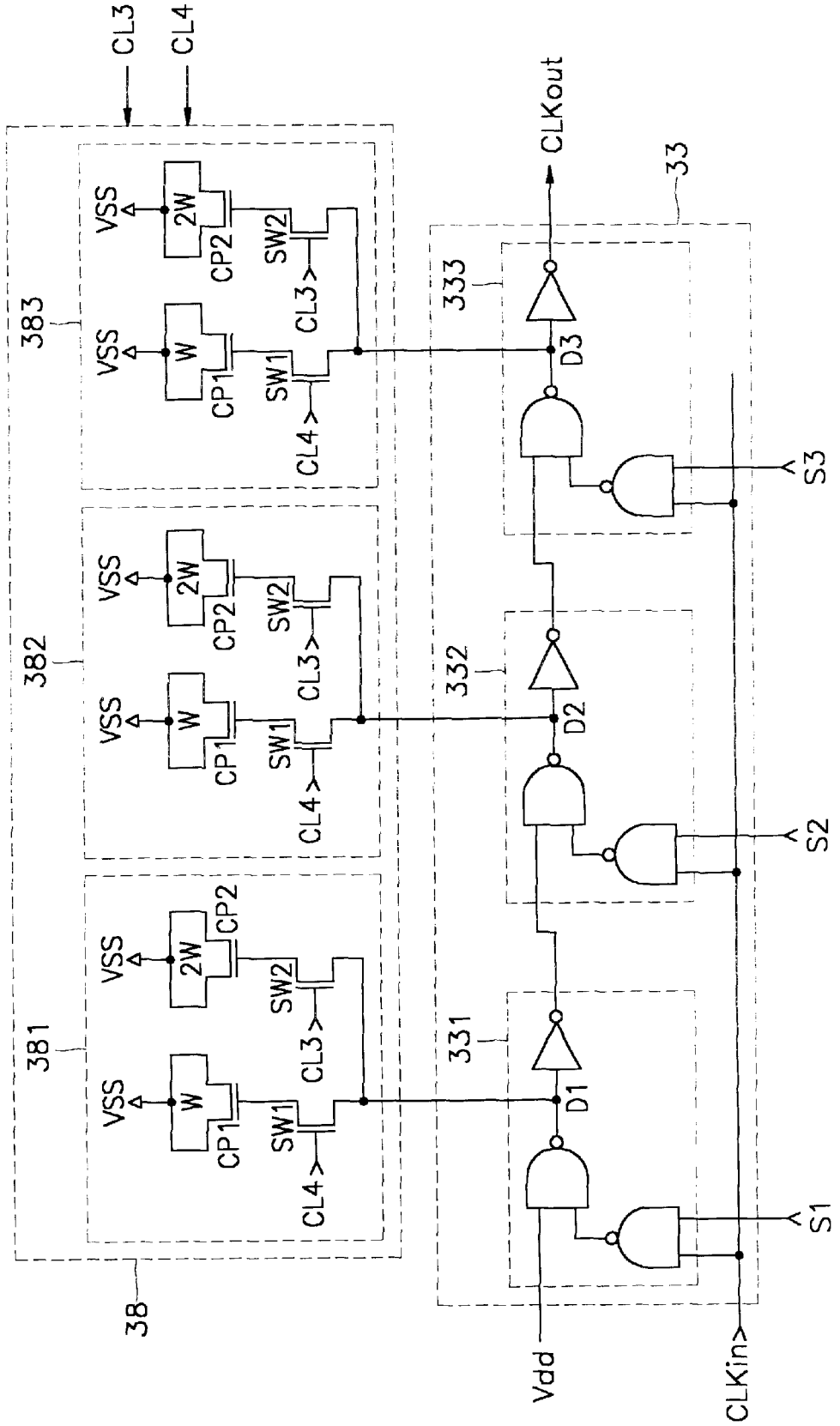
FIG. 4 is a diagram of a delay line and one example of a unit delay time adjustment circuit of the DLL circuit shown in FIG. 3.

FIG.4 is a diagram of the delay line 33 and the unit delay time adjustment circuit 38 shown in the DLL circuit of FIG.

3. Referring to FIG. 4, the delay line 33 includes a plurality of unit delay circuits 331, 332, and 333 connected to each other in series. The device of this example is configured with three (3) unit delay circuits as shown. The delay line 33 delays an external signal CLKin via a number of unit delay circuits which are effectively enabled by the control signals S1, S2, and S3, so as to output the delayed external signal as an internal signal CLKout. For example, when the control signals S1, S2, and S3, are 0, 1, and 0, respectively, the external signal CLKin is delayed by the two unit delay circuits 332 and 333. When the control signals S1, S2, and S3 are shifted to the left (by control circuit 35 of FIG. 3) so as to be 1, 0, and 0, respectively, the external signal CLKin is delayed by the unit delay circuits 331, 332, and 333.

It is preferable that the delay times of the unit delay circuits 331, 332, and 333, be short to provide a sufficient locking resolution in a high-frequency domain (CL=5). On the other hand, it is preferable that the delay times of the unit delay circuits 331, 332, and 333, be long to reduce a maximum number of locking cycles in a low frequency domain. As explained below, the unit delay time adjustment circuit 38 functions to increase the unit delay time of the unit delay circuits in the lower frequency domains relative to those of the higher frequency domains.

Referring still to FIG. 4, the unit delay time adjustment circuit 38 of this embodiment includes a plurality of programmable delay devices 381, 382, and 383, which are respectively connected to the unit delay circuits 331, 332, and 333. The programmable delay devices 381, 382, and 383, selectively increase the delay time of each of the respective unit delay circuits 331, 332, and 333, in response to the CAS latency signals CL3 and CL4.

In this example, the programmable delay devices 381, 382, and 383, each include first and second switches SW1 and SW2 and first and second MOS capacitors CP1 and CP2. Ends of the first switches SW1 are connected to nodes D1, D2, and D3 of the unit delay circuits 331, 332, and 333, and are turned on or off in response to the CAS latency signal CL4. Ends of the second switches SW2 are also connected to the nodes D1, D2, and D3, and are turned on or off in response to the CAS latency signal CL3. The first MOS capacitors CP1 are connected between the other ends of the first switches SW1 and ground voltages VSS, and the second MOS capacitors CP2 are connected between the other ends of the second switches SW2 and grounds voltages VSS. In this example, the capacitance of each of the second MOS capacitors CP2 is greater than the capacitance of each of the first MOS capacitors CP1.

In operation, if the CAS latency is 5 (high-frequency domain), the CAS latency signals CL3 and CL4 are disabled to logic "low". As a result, all of the first and second switches SW1 and SW2 are turned off, and the load capacitance at each of the nodes D1 D2, and D3, of the unit delay circuits 331, 332, and 333, is not increased. Thus, the delay times of the unit delay circuits 331, 332, and 333, are not increased, and a fine locking resolution in the high-frequency domain is maintained.

If CAS latency is 4 (middle frequency domain), the CAS latency signal CL4 is enabled to logic "high", and the CAS latency signal CL3 remains disabled at logic "low". As a result, the first switches SW1 are turned on, and the second switches SW2 remain off. Thus, the MOS capacitors CP1 are operatively connected to the nodes D1, D2, and D3. As a result, the load capacitance at each of the nodes D1, D2, and D3 is increased, and the delay time of each of the unit delay circuits 331, 332, and 333 is increased.

If the CAS latency is 3 (low frequency domain), the CAS latency signal CL3 is enabled to logic "high" and the CAS latency signal CL4 is disabled to logic "low". As a result, the first switches SW1 are turned off, and the second switches SW2 are turned on. Thus, the second MOS capacitors CP2 become operatively connected to the nodes D1, D2, and D3. As a result, the load capacitance at each of the nodes D1, D2, and D3 is further increased, and the delay time of each of the unit delay circuits 331, 332, and 333, is further increased.

It is possible, of course, to vary the on/off behavior of the switches SW1 and SW2 relative to the states of the CAS latency signals 3 and 4, for example, in the case where the capacitance of each of the second MOS capacitors CP2 is greater than or equal to the capacitance of each of the first MOS capacitors CP1. That is, one or both capacitors could be selectively connected to the nodes of the unit delay circuits, so long as the switch and capacitor elements function to increase capacitive load at each unit delay circuit when CAS latency is 4, and to further increase the capacitive load when CAS latency is 3. There may be many ways of achieving this result other than the particular configuration of FIG. 4.

Likewise, the first and second capacitors of FIG. 4 are illustrated as NMOS transistors. Other capacitive elements may be used, including PMOS transistors. In the case of PMOS transistors, the ends of the first and second capacitors would be connected to power voltages VDD instead of the ground voltages VSS.

Figure 5:
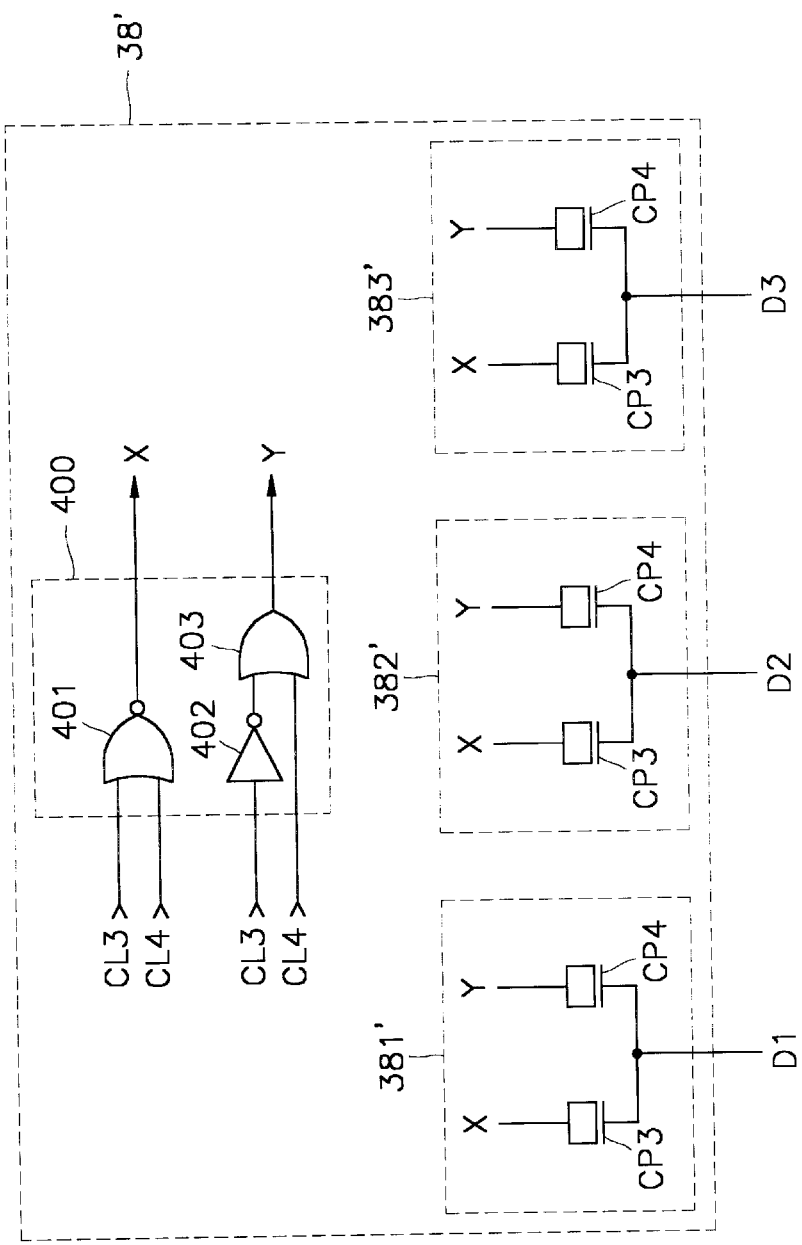
FIG. 5 is a diagram of another example of the unit delay time adjustment circuit of the DLL circuit shown in FIG. 3.

FIG. 5 is a detailed circuit diagram of another example of the unit delay time adjustment circuit 38 of the DLL circuit shown in FIG. 3. Referring to FIG. 5, a unit delay time adjustment circuit 38' includes programmable delay devices 381', 382', and 383' and a logic circuit 400.

The programmable delay devices 381', 382', and 383' each include first and second MOS capacitors CP3 and CP4. Ends of the first and second MOS capacitors CP3 and CP4 are connected to nodes D1, D2, and D3 of unit delay circuits 331, 332, and 333 (FIG. 4). The other ends of the first capacitors CP3 are connected to first output nodes X of the logic circuit 400 and the other ends of the second capacitors CP4 are connected to second output nodes Y of the logic circuit 400.

In this example, the logic circuit 400 includes a NOR gate 401, an inverter 402, and an OR gate 403. The logic circuit 400 outputs a logic "low" value to the first and second output nodes X and Y when the CAS latency signal CL3 is logic "high", and outputs a logic "low" value to the first output node X and a logic "high" value to the second output node Y when the CAS latency signal CL4 is logic "high".

In operation, if CAS latency is 5, the CAS latency signals CL3 and CL4 are disabled to logic "low". As a result, the first and second output nodes X and Y of the logic circuit 400 are logic "high". Thus, the load capacitance of the nodes D1, D2, and D3 of the unit delay circuits 331, 332, and 333, are not increased (or only slightly increased), and the delay times of the unit delay circuits 331, 332, and 333, are not increased. If CAS latency is 4, the CAS latency signal CL4 remains enabled at logic "high", and the CAS latency signal CL3 is disabled at logic "low". As a result, the first output node X of the logic circuit 400 is logic "low", and the second output node Y of the logic circuit 400 is logic "high". Thus, the load capacitance at the nodes D1, D2, and D3 are increased by the respective capacitors CP3, and the delay times of the unit delay circuits 331, 332, and 333, (FIG. 4) are increased.

If the CAS latency is 3, the CAS latency signal CL3 is enabled to logic "high" and the CAS latency signal CL4 is disabled to logic "low". As a result, the first and second output nodes X and Y of the logic circuit 400 become logic "low". Thus, the load capacitance of the nodes D1, D2, and D3 are further increased by the capacitors CP3 and CP4, and the delay times of the unit delay circuits 331, 332, and 333 (FIG. 4) are further increased.

Figure 6:
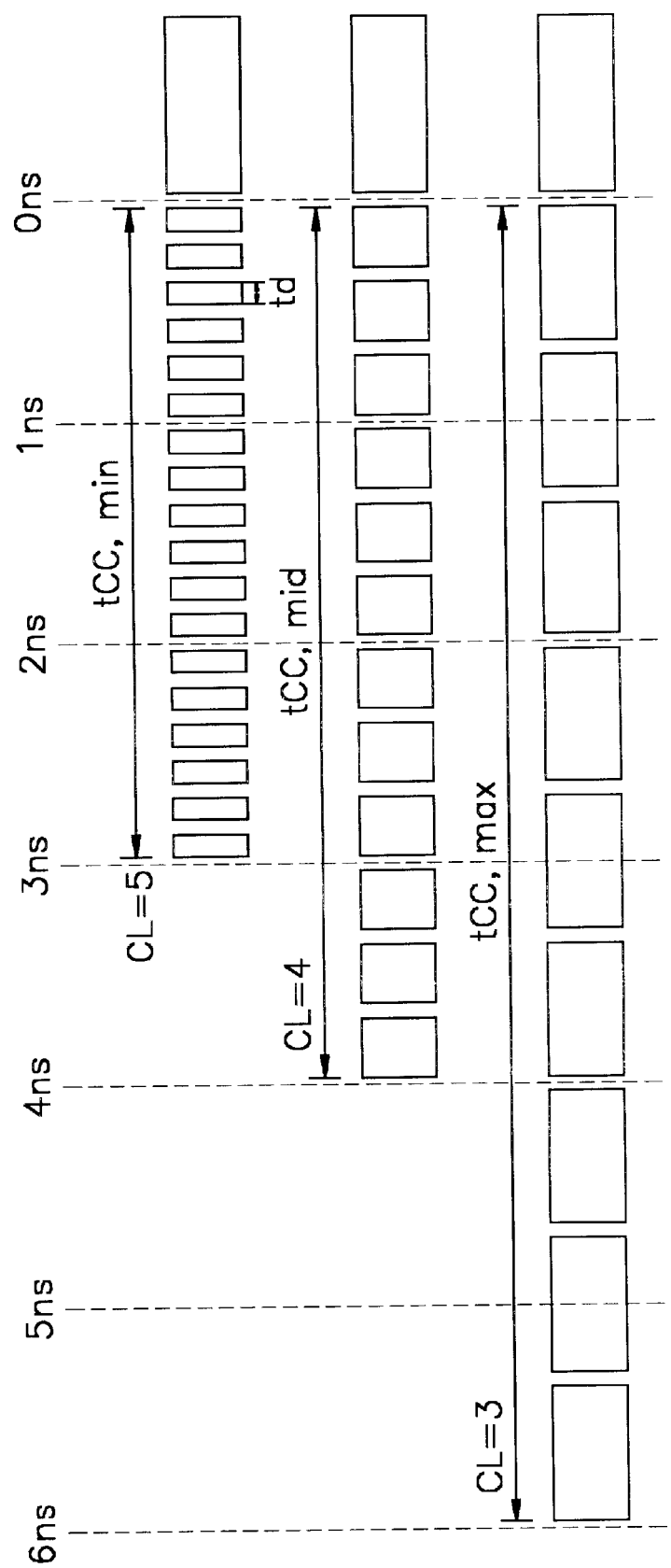
FIG. 6 is a diagram showing the relationship between a clock period of an operational clock and a delay time of unit delay circuits in the DLL circuit shown in FIG. 3.

FIG. 6 shows the relationship between clock period tCC of an operational clock and the delay time td of the unit delay circuits in the DLL circuit shown in FIG. 3. The illustrated relationships are based on a synchronous DRAM in which a CAS latency (CL) is 3 when the frequency of an operational clock is within the range of 166 MHz–200 MHz, the CL is 4 when the frequency of the operational clock is within the range of 200 MHz–250 MHz, and the CL is 5 when the frequency of the operational clock is within the range of 250 MHz–300 MHz.

As shown in FIG. 6, according to the present example, the delay time td (locking resolution) of each unit delay circuit is ⅙ ns in a high frequency domain (CL=5); the delay time td (locking resolution) of each unit delay circuit is ⅖ ns in a middle frequency domain (CL=4); and the delay time td (locking resolution) of each unit delay circuit is ⅘ ns in a low frequency domain (CL=3).

Figure 1:
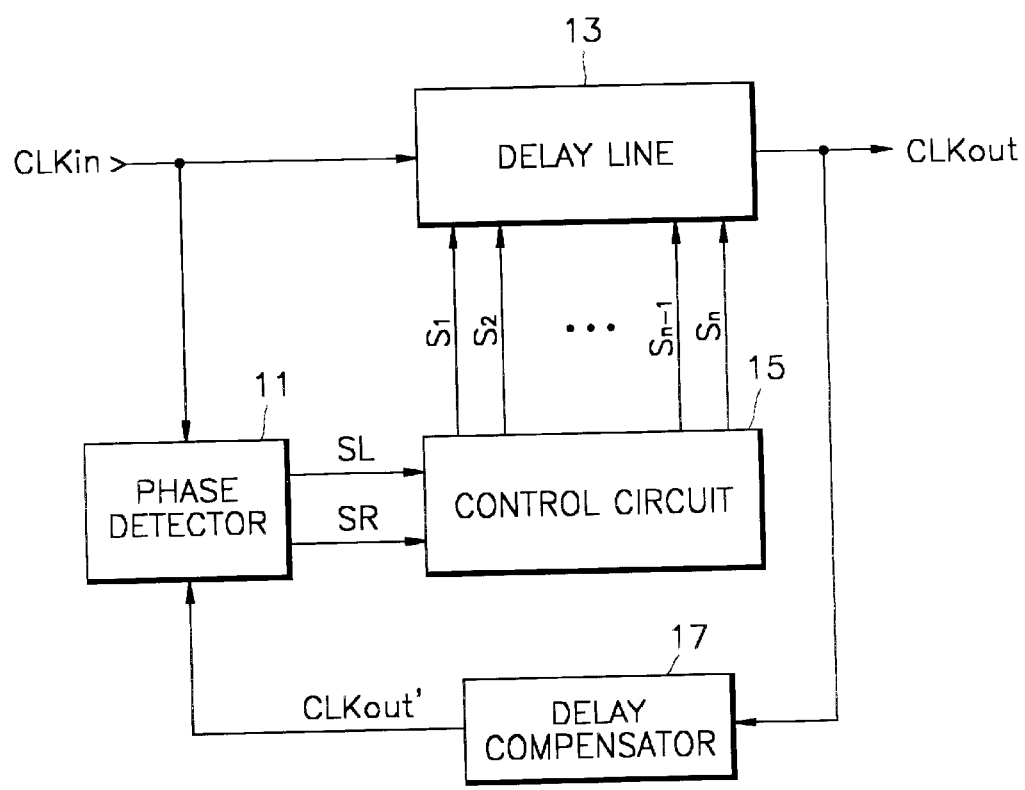
FIG. 1 is a block diagram of a conventional register-controlled delay locked loop (RDLL) circuit.
Figure 2:
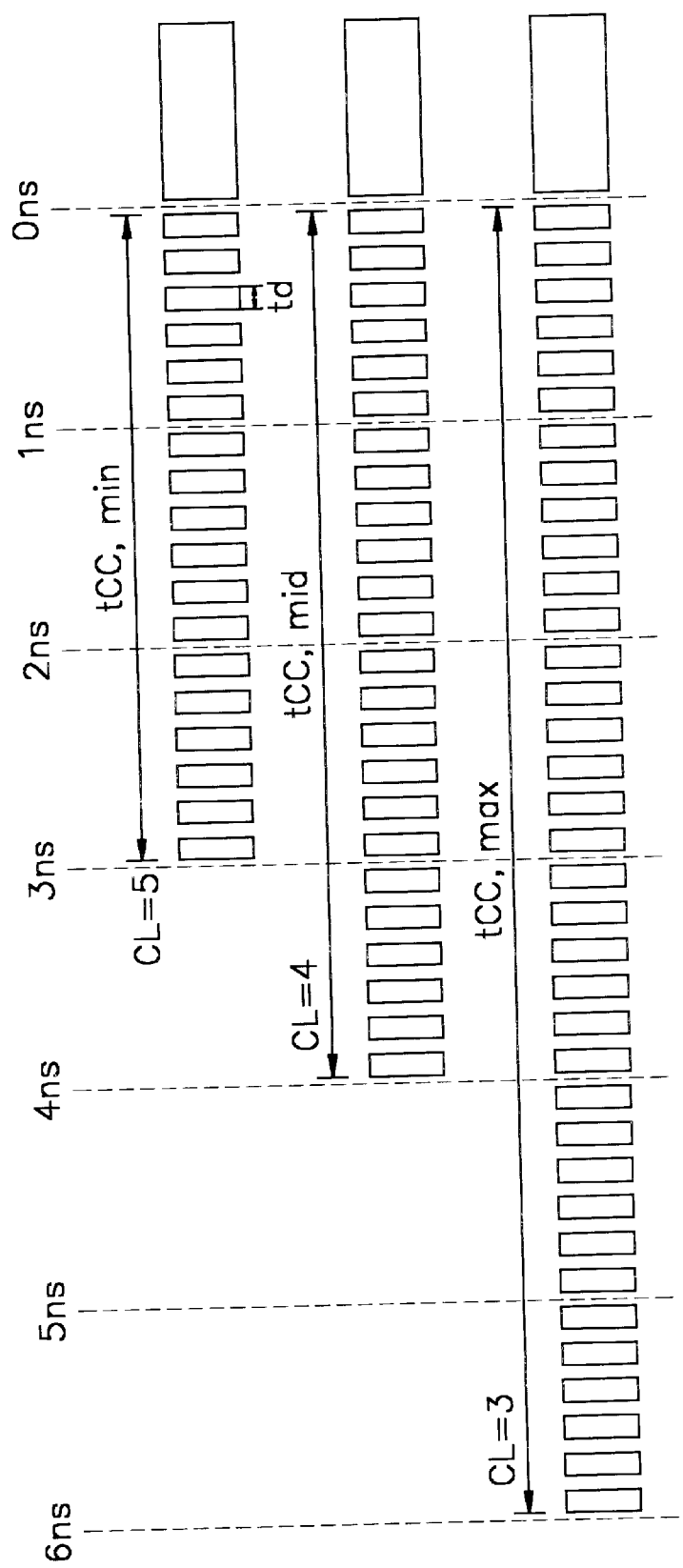
FIG. 2 is a diagram showing the relationship between a clock period of an operational clock and a delay time of unit delay circuits in the conventional DLL of FIG.

Accordingly, a fine locking resolution in the high frequency domain is achieved by the provision of unit delay circuits having relative short unit delay times. On the other hand, the provision of a large number of such unit delay circuits for operation in the low frequency domain is avoided by selectively increasing the unit delay time of each unit delay circuit. As such, a wide locking range is achieved while reducing a number of locking cycles needed in the low frequency domain. In the present example, the maximum locking time is reduce to 9 cycles in the low-frequency domain where CL=3, as compared with 36 cycles in the conventional DLL circuit of FIG. 1.

For descriptive convenience, in the example of FIG. 6, the delay times td of the unit delay circuits are doubled each time the CAS latency is reduced. However, the invention is not limited in this manner, and other relative increases in the unit delay times td may be adopted.

Figure 7:
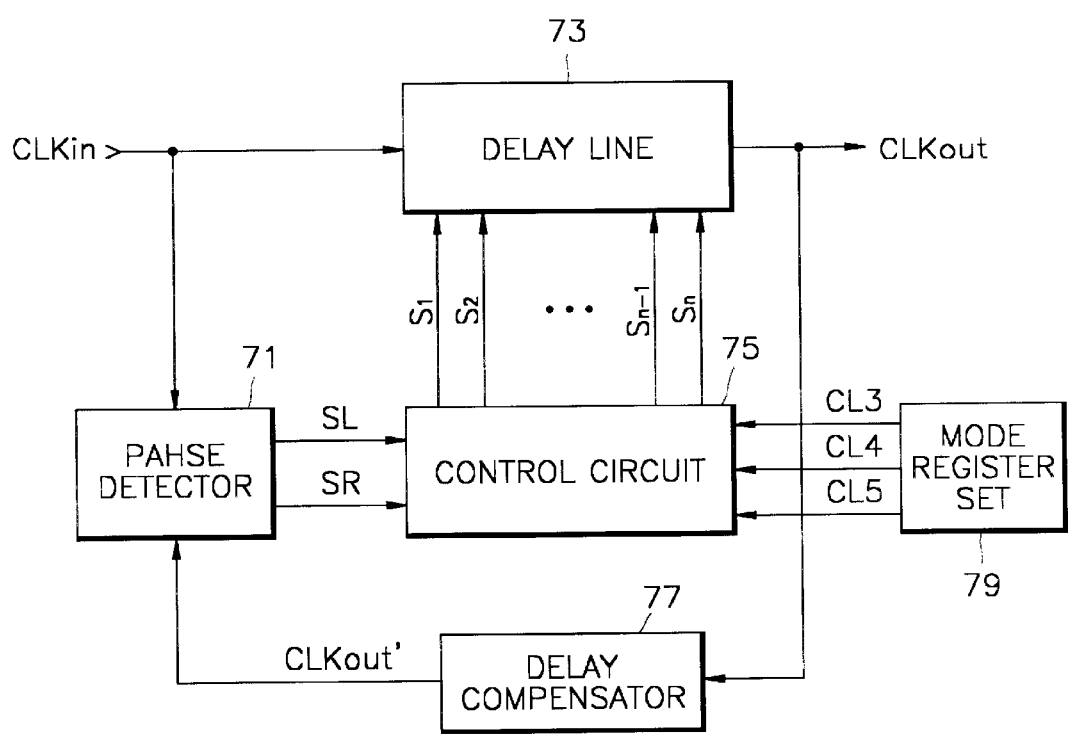
FIG. 7 is a block diagram of a DLL circuit according to a second embodiment of the present invention.

FIG. 7 is a block diagram of a DLL circuit according to a second embodiment of the present invention. The DLL circuit of this embodiment includes a phase detector 71, a delay line 73, a control circuit 75, a delay compensator 77, and a Mode register set 79.

As shown, an external clock signal CLKin is delayed by the delay line 73 to produce an internal clock signal CLKout which is delayed relative to the external clock signal CLKin. The delay line 73 includes a plurality of unit delay circuits (not shown) which are selectively made operational in response to respective control signals S1 through Sn. The unit delay circuits are cascaded (connected in series) such that an amount of delay of the internal clock signal CLKout relative to the external clock signal CLKin depends on a number of the unit delay circuits which are enabled by the control signals S1 through Sn.

The phase detector 71 receives a signal CLKout' (which is the internal signal CLKout after passing through the delay compensator 77) and the external signal CLKin. When the DLL circuit is used in a synchronous DRAM, the delay compensator 77, which is a kind of delay circuit, has a delay time corresponding to the sum of the delay time of an input buffer for buffering the external signal CLKin and the delay time from outputting of data to an output pin in response to the internal signal CLKout. The delay compensator 77 may be omitted from the DLL circuit, and in this case, the internal clock signal CLKout is directly input to the phase detector 71.

The phase detector 71 detects a phase difference between the internal clock signal CLKout (or CLKout') and the external clock signal CLKin. Further, the phase detector 71 generates a shift right (SR) signal or a shift left (SL) signal based on the phase of the internal signal CLKout relative to the external signal CLKin. That is, an SR signal is generated when the internal signal CLKout lags behind the external signal CLKin, and an SL signal is generated when the internal signal CLKout leads the external signal CLKin.

The control circuit 75 functions as a shift register circuit having plural circuit stages which output parallel control signals S1 through Sn to the unit delay circuits, respectively, of the delay line 73. The control signals S1 through Sn essentially constitute a multi-bit output of the control circuit 75.

As in the first embodiment, the mode register set 79 stores a value indicative of a CAS latency of the memory device. Also like the first embodiment, the control circuit 75 is responsive to the phase detector 71 to conductive a bit-shift of the output control signals S1 through Sn in a direction corresponding to the signal SL or SR output by the phase detector 71. However, the control circuit 75 differs from that of the first embodiment in that (in addition to a variable bit-shift direction) the number of stages of each bit-shift operation of the control circuit 75 is made variable and is controlled by the CAS latency value stored in the mode register 79. In this manner, the control circuit 75 effectively varies a locking phase step of the delay line 73 according to a CAS latency indicated by the Mode register set 79. The structure and operation of the control circuit 75 of this embodiment is described in greater detail below with reference to FIG. 8.

Figure 8:
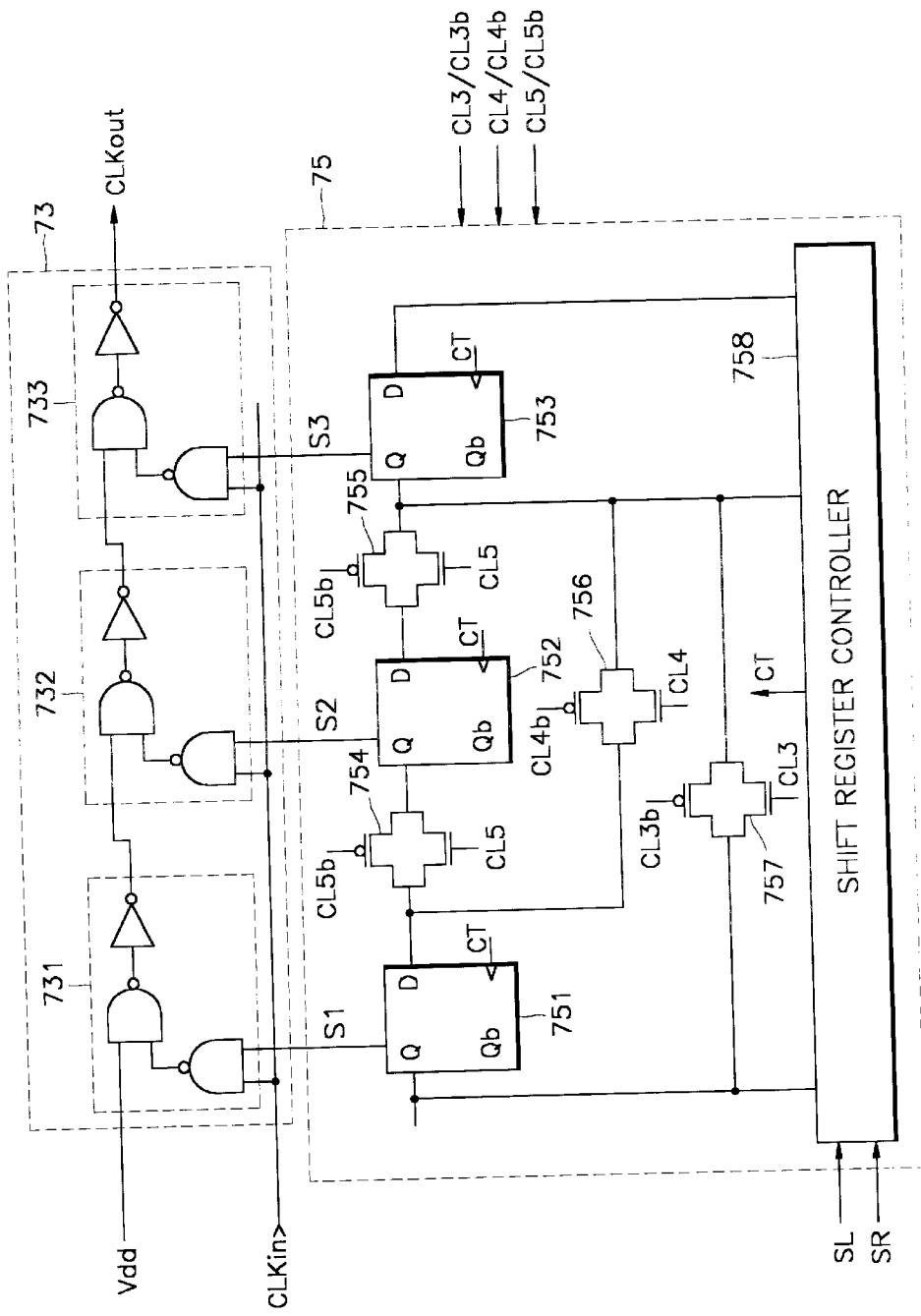
FIG. 8 is a diagram of a delay line and a control circuit of the DLL circuit shown in FIG. 7.

FIG. 8 is a circuit diagram of the delay line 73 and the control circuit 75 shown in FIG. 7. The unit delay circuits 731, 732, and 733 of the delay line 73 are the same as the unit delay circuits 331, 332, and 333 shown in FIG. 4. The control circuit 75 is effectively a shift register having a plurality of stages, i.e., flip-flops 751, 752, and 753, a plurality of switches 754 through 757, and a shift register controller 758. In FIG. 8, only three stages are illustrated for descriptive convenience.

The control signals S1, S2, and S3, are output from the output nodes of the stages 751, 752, and 753, and the shift register controller 758 controls the shift direction of the control signals S1, S2, and S3, in response to the signals SL and SR output from the phase detector 71 (FIG. 7).

As shown in FIG. 8, the switches 754 through 757 are connected between stages 751, 752 and 753 and are turned on or off in response to the CAS latency signals CL3, CL4, and CL5. More precisely, the switch 754 is connected between an input node of the stage 751 and an output node of the stage 752, and is turned on when the CAS latency signal CL5 is enabled to a logic "high". The switch 755 is connected between an input node of the stage 752 and an output node of the stage 753, and is also turned on when the CAS latency signal CL5 is enabled to a logic "high". The switch 756 is connected between the input node of the stage 751 and the output node of the stage 753, and is turned on when the CAS latency signal CL4 is enabled to a logic "high". The switch 757 is connected between an output node of the stage 751 and the output node of the stage 753, and is turned on when the CAS latency signal CL3 is enabled to a logic "high".

In operation, if CAS latency 5, the CAS latency signal CL5 is enabled to a logic "high" and the CAS latency signals CL3 and CL4 are disabled to a logic "low". As a result, the switches 754 and 755 are turned on, and the switches 756 and 757 are turned off. Thus, a value input via an input node of the stage 753 is shifted one stage at a time in response to a control clock CT. If CAS latency is 4, the CAS latency signal CL4 is enabled to a logic "high" and the CAS latency signals CL3 and CL5 are disabled to a logic "low". As a result, the switches 754, 755, and 757 are turned off, and the switch 756 is turned on. The output node of the stage 752 is reset as 0 (not shown). Thus, a value input via the input node of the stage 753 is shifted two stages at a time in response to the control clock CT. If CAS latency is 3, the CAS latency signal CL3 is enabled to a logic "high" and the CAS latency signals CL4 and CL5 are disabled to a logic "low". The output nodes of the stages 751 and 752 are reset as 0 (not shown) As a result, the switches 754, 755, and 756 are turned off, and the switch 757 is turned on. Thus, a value input via the input node of the stage 753 is shifted three stages at a time in response to the control clock CT. The states of the outputs of the respectively stages are latched same value after finishing locking operation.

In this manner, the control circuit 75 varies the locking phase step of the delay line 73, i.e., the locking resolution, in response to the CAS latency signals CL3, CL4, and CL5. For example, assume that the delay time of the unit delay circuits 731, 732, and 733 is 1/6 ns. In a high frequency domain where CAS latency is 5, the control circuit 75 conducts the bit-shift operation one stage at a time, and the locking resolution is 1/6 ns. In a middle frequency domain where CAS latency is 4, the control circuit 75 conducts the bit-shift operation two stages at a time, and the locking resolution is 2/6 ns. In a low frequency domain where CAS latency is 3, the control circuit 75 conducts the bit-shift operation three stages at a time, and the locking resolution is 3/6 ns.

Accordingly, a fine locking resolution in the high frequency domain is achieved by the provision of unit delay circuits having relative short unit delay times. On the other hand, the provision of a large number of such unit delay circuits for operation in the low frequency domain is avoided by selectively increasing a number of stages of a bit-shift operation according to CAS latency. As such, a wide locking range is achieved while reducing a number of locking cycles needed in the low frequency domain.

For descriptive convenience, in the example of FIG. 8, the number of stages of the bit-shift operation is incremented each time the CAS latency is reduced. However, the invention is not limited in this manner, and other relative increases in the number of stages may be adopted.

Figure 9:
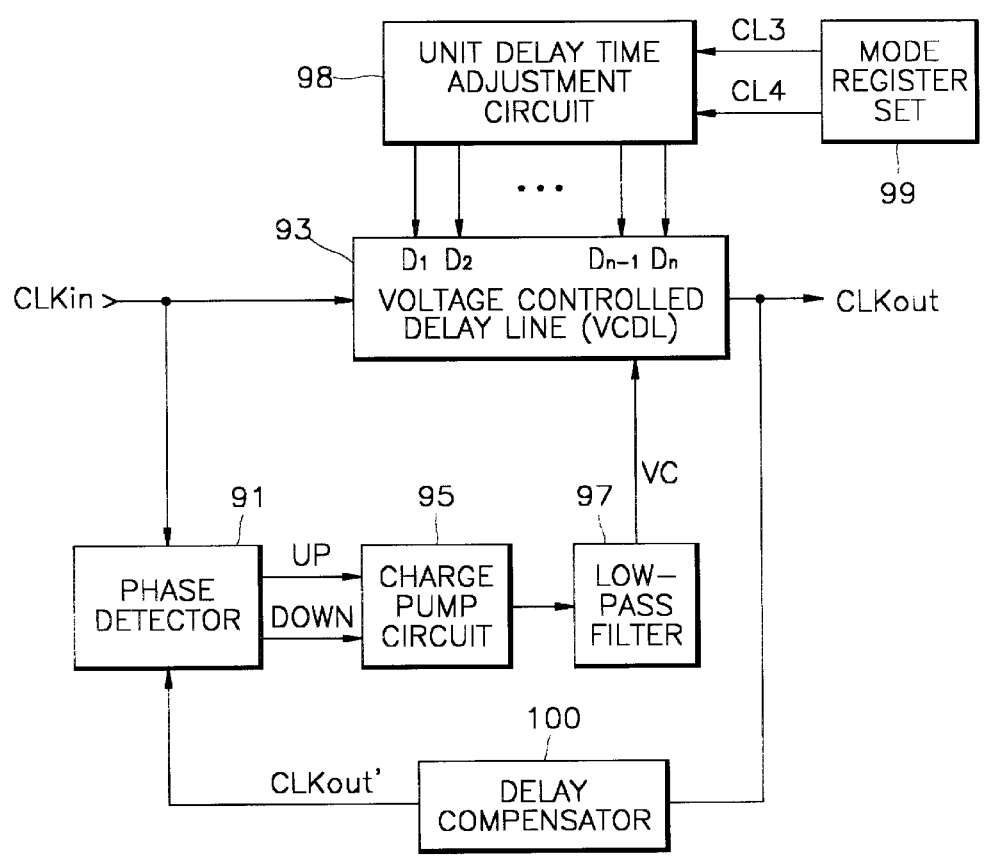
FIG. 9 is a diagram of an analog DLL circuit according to a third embodiment of the present invention.

FIG. 9 is a block diagram of a DLL circuit according to a third embodiment of the present invention. The first and second embodiments are configured as digital DLL circuits, whereas the third embodiment is configured as an analog DLL circuit.

Referring to FIG. 9, the analog DLL circuit includes a phase detector 91, a voltage controlled delay line (VCDL) 93, a charge pump circuit 95, a low-pass filter 97, a unit delay time adjustment circuit 98, a Mode register set 99, and a delay compensator 100.

As shown, an external clock signal CLKin is delayed by the VCDL 93 to produce an internal clock signal CLKout which is delayed relative to the external clock signal CLKin. The VCDL 93 includes a plurality of analog unit delay circuits (not shown) which are operated in response to a control signal VC. The unit delay circuits are connected in series and an amount of delay of the internal clock signal CLKout relative to the external clock signal CLKin depends on a voltage of the control signal VC.

The phase detector 91 receives a signal CLKout' (which is the internal signal CLKout after passing through the delay compensator 100) and the external signal CLKin. As before, the delay compensator 100 may be omitted from the DLL circuit, and in this case, the internal clock signal CLKout is directly input to the phase detector 91.

The phase detector 91 detects a phase difference between the internal clock signal CLKout (or CLKout') and the external clock signal CLKin. Further, the phase detector 91 generates an UP signal or a DOWN signal based on the phase of the internal signal CLKout relative to the external signal CLKin. That is, a DOWN signal is generated when the internal signal CLKout lags behind the external signal CLKin, and an UP signal is generated when the internal signal CLKout leads the external signal CLKin.

The charge pump circuit 95 generates the control voltage Vc, via the low-pass filter 97, in response to the UP and DOWN signals output from the phase detector 95. As such, the delay of the VCDL 93 is controlled according to the phase difference between the internal clock signal CLKout (or CLKout') and the external clock signal CLKin.

The structure and operation of the unit delay time adjustment circuit 98 and the Mode register set 99 are the same as those of the unit delay time adjustment circuit 38 and the Mode register set 39 described in the first embodiment of FIG. 3. That is, the unit delay time adjustment circuit 98 varies a capacitive load at each of the unit delay circuits of the VCDL in accordance with the CAS latency values of the mode register set 99. Thus, the analog DLL circuit according to the third embodiment achieves essentially the same effects and advantages as the digital DLL circuit according to the first embodiment of FIG. 3.

Figure 10:
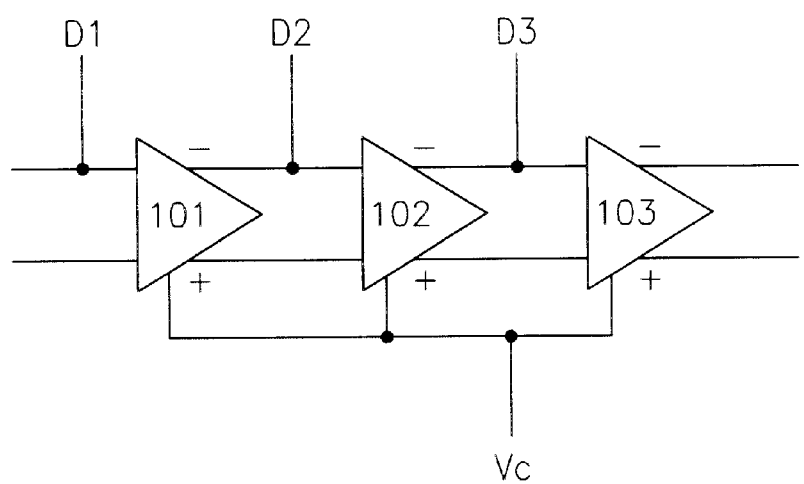
FIG. 10 is a diagram of a delay line in the analog DLL circuit of FIG. 9.

FIG. 10 is a diagram showing the configuration of the VCDL 93 of FIG. 9. As shown, the VCDL 93 includes a plurality of analog variable delay circuits 101, 102, and 103, which are controlled by the control voltage Vc. Each of nodes D1, D2, and D3, is coupled to the unit delay time adjustment circuit 98 (FIG. 9), where the capacitive load of each node is varied as described previously. It is noted that FIG. 10 illustrates three delay circuits 101, 102, and 103, for convenience only, and that a different number of such delay circuits may be provided.

As with the first embodiment, the analog DLL circuit according to the third embodiment exhibits a wide locking range and reduces locking time without increasing the number of unit delay circuits.

Although the invention has been described with reference to the preferred embodiments shown in the drawings, the drawings are for illustration purposes only. As it will be apparent to one of ordinary skill in the art that modifications of the described embodiments may be made without departing from the spirit and scope of the invention, the scope of the appended claims is not to be interpreted as being restricted to these embodiments.

What is claimed is:

1. A delay locked loop circuit for a memory device, comprising:
   a delay line which receives an input clock signal and which includes a cascaded plurality of unit delay circuits;
   an adjustment circuit which varies a delay time of said unit delay circuits according to a column-address-strobe (CAS) latency of the memory device;
   a phase detector which detects a phase difference between the input clock signal and an output clock signal of said delay line; and a control circuit which controls an enabled state of said unit delay circuits according to an output of said phase detector.

2. The delay locked loop circuit of claim 1, further comprising a mode register set for outputting a signal indicative of the CAS latency to said adjustment circuit.

3. The delay locked loop circuit of claim 2, wherein said adjustment circuit comprises a plurality of variable delay circuits coupled to said unit delay circuits, respectively, wherein each of said variable delay circuits is responsive to the signal output from said mode register set to control an amount of delay of a respective unit delay circuit.

4. The delay locked loop circuit of claim 3, wherein each of said variable delay circuits comprises plural circuits connected in parallel between a source voltage and a respective unit delay circuit, each said circuit comprising a capacitor and a switch connected in series,
wherein an ON/OFF state of said switch of each of said plural circuits is controlled by the output of said mode register set.

5. The delay locked loop circuit of claim 4, wherein the capacitor of each said circuit is an NMOS capacitor and the source voltage is a ground voltage.

6. The delay locked loop circuit of claim 3, wherein the capacitor of each said circuit is a PMOS capacitor and the source voltage is a power voltage.

7. The delay locked loop circuit of claim 3, wherein said adjustment circuit further comprises:
a logic circuit, having plural output terminals, for generating respective logic values on the plural output terminals in response to the signal output from said mode register set;
wherein each of said variable delay circuits comprises plural capacitors which are each connected in parallel between a respective unit delay circuit and a respective one of said plural output terminals of said logic circuit.

8. The delay locked loop circuit of claim 1, wherein said unit delay circuits are digital circuits, wherein said control circuit comprises a shift register circuit which outputs parallel control signals to said unit delay circuits, respectively, and wherein a bit-shift direction of said shift register circuit is controlled by the output of said phase detector.

9. The delay locked loop circuit of claim 4, wherein said unit delay circuits are digital circuits, wherein said control circuit comprises a shift register circuit which outputs parallel control signals to said unit delay circuits, respectively, and wherein a bit-shift direction of said shift register circuit is controlled by the output of said phase detector.

10. The delay locked loop circuit of claim 7, wherein said unit delay circuits are digital circuits, wherein said control circuit comprises a shift register circuit which outputs parallel control signals to said unit delay circuits, respectively, and wherein a bit-shift direction of said shift register circuit is controlled by the output of said phase detector.

11. The delay locked loop circuit of claim 1, wherein said unit delay circuits are analog circuits, wherein said control circuit comprises a charge pump and a low pass filter, wherein an output of said low pass filter is commonly connected to said unit delay circuits, and wherein a charge direction of said charge pump is controlled by an output of said phase detector.

12. The delay locked loop circuit of claim 4, wherein said unit delay circuits are analog circuits, wherein said control circuit comprises a charge pump and a low pass filter, wherein an output of said low pass filter is commonly connected to said unit delay circuits, and wherein a charge direction of said charge pump is controlled by an output of said phase detector.

13. The delay locked loop circuit of claim 7, wherein said unit delay circuits are analog circuits, wherein said control circuit comprises a charge pump and a low pass filter, wherein an output of said low pass filter is commonly connected to said unit delay circuits, and wherein a charge direction of said charge pump is controlled by an output of said phase detector.

14. The delay locked loop circuit of claim 1, further comprising a delay compensation circuit interposed between the output of said delay line and an input of said phase detector, wherein said phase detector detects the phase difference between the input clock signal and the output clock signal of said delay line after the output clock signal is delayed by said delay compensation circuit.

15. A delay locked loop method for a memory device, comprising:
delaying an input clock signal to obtain a delayed clock signal by passing the input clock signal through a delay line having a cascaded plurality of unit delay circuits;
controlling an enabled state of each of the unit delay circuits according to a phase difference between the input clock signal and the delayed clock signal; and
varying a delay time of the unit delay circuits according to a column-address-strobe (CAS) latency of the memory device.

16. The delay locked loop method of claim 15, wherein the delay time of the unit delay circuits is increased as the CAS latency of the memory device is decreased.

17. The delay locked loop method of claim 15, wherein the delay time of the unit delay circuits is varied by altering a capacitive load operatively connected to the unit delay circuits.

18. The delay locked loop method of claim 15, further comprising storing a value indicative of the CAS latency of the memory device, and controlling an on/off state of plural switched capacitor circuits according to the stored value indicative of the CAS latency, wherein the switched capacitor circuits are operatively connected to the unit delay circuits, respectively.

19. A delay locked loop circuit for a memory device, comprising:
a delay line which receives an input clock signal and which includes a cascaded plurality of unit delay circuits;
a shift register circuit having plural circuit stages which output parallel control signals to said unit delay circuits, respectively, wherein said parallel control signals constitute a multi-bit output of said shift register circuit, wherein the number of stages of each bit-shift operation of said shift register circuit is controlled by a column address strobe (CAS) latency of the memory device, and wherein a direction and a number of stages of the bit-shift operation of said shift register circuit are variable; and
a phase detector for detecting a phase difference between the input clock signal and an output clock signal of said delay line, wherein the direction of the bit-shift operation of said shift register circuit is controlled by an output of said phase detector.

20. The delay locked loop circuit of claim 19, further comprising a mode register set which stores a value indicative of the CAS latency.

21. The delay locked loop circuit of claim 20, wherein said shift register circuit comprises:
plural flip-flop circuit stages; and
a plurality of switching circuits which selectively enable said plural flip-flop circuit stages during the bit-shift operation according to the value stored in said mode register set.

22. The delay locked loop circuit of claim 20, wherein the shift register circuit comprises:

first, second and third flip-flop circuits;

a first switch connected in series between an output node of the first flip-flop circuit and an output node of the third flip-flop circuit;

a second switch connected in series between the output node of the first flip-flop circuit and an input node of the third flip-flop circuit;

a third switch connected in series between the output node of the first flip-flop circuit and an input node of the second flip-flop circuit; and a fourth switch connected in series between an output node of the second flip-flop circuit and the input node of the third flip-flop circuit.

23. The delay locked loop circuit of claim 22, wherein an output of said mode register set controls an ON/OFF state of each of said first through fourth switches.

24. The delay locked loop circuit of claim 23, wherein the first switch is closed and the second through fourth switches are open when a number of stages of each bit-shift operation is three, wherein the second switch is closed and the first, third and fourth switches are open when a number of stages of each shift operation is two, and wherein the third and fourth switches are closed and the first and second switches are open when the number of stages of each shift operation is one.

25. The delay locked loop circuit of claim 19, further comprising a delay compensation circuit interposed between the output of said delay line and an input of said phase detector detects the phase difference between the input clock signal and the output clock signal of said delay line after output clock signal is delayed by said delay compensation circuit.

26. A delay locked loop method for a memory device, comprising:

delaying an input clock signal to obtain a delayed clock signal by passing the input clock signal through a delay line having a cascaded plurality of unit delay circuits;

generating a multi-bit control signal which controls an enabled state of each of the plurality of unit delay circuits; and bit-shifting the multi-bit control signal in a direction corresponding to a phase difference between the input clock signal and the delayed clock signal, and by a number of bits corresponding to a column address strobe (CAS) latency of the memory device.

27. The delay locked loop method of claim 26, wherein the number of bits of the bit-shifting of the multi-bit control signal is increased as the CAS latency of the memory device is decreased.

28. The delay locked loop method of claim 26, further comprising storing a value indicative of the CAS latency of the memory device, and controlling an enabled state of plural shift register stages according to the stored value indicative of the CAS latency, wherein the plural shift register stages generate the multi-bit control signal.

* * * * *